United States Patent
Wang et al.

(10) Patent No.: US 10,907,907 B2
(45) Date of Patent: Feb. 2, 2021

(54) HEAT DISSIPATION STRUCTURE

(71) Applicant: COOLER MASTER CO.,LTD., New Taipei (TW)

(72) Inventors: Chi-Chuan Wang, New Taipei (TW); Chang-Yu Hsieh, New Taipei (TW); Shan-Yin Cheng, New Taipei (TW); Hsiang-Fen Chou, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 6 days.

(21) Appl. No.: 15/921,623

(22) Filed: Mar. 14, 2018

(65) Prior Publication Data

US 2019/0195567 A1    Jun. 27, 2019

(30) Foreign Application Priority Data

Dec. 26, 2017  (TW) .............................. 106145694 A (51) Int. Cl.
| | |
|---|---|
| *F28D 15/02* | (2006.01) |
| *H05K 7/20* | (2006.01) |
| *F28F 13/08* | (2006.01) |
| *F28F 3/12* | (2006.01) |
| *F28D 21/00* | (2006.01) |

(52) U.S. Cl.
CPC ..... *F28D 15/0266* (2013.01); *F28D 15/0233* (2013.01); *F28F 3/12* (2013.01); *F28F 13/08* (2013.01); *F28D 2015/0216* (2013.01); *F28D 2021/0028* (2013.01); *H05K 7/20* (2013.01); *H05K 7/20336* (2013.01)

(58) Field of Classification Search
CPC ......... F28D 15/0266; F28D 2015/0216; F28D 15/0233; F28D 15/025; F28D 2021/0028; F28F 13/08; F28F 13/12; F28F 3/12; H05K 7/20336
USPC .............................................. 165/104.21, 170
See application file for complete search history.

(56) References Cited

U.S. PATENT DOCUMENTS 2,058,871 A * 10/1936 Heath .................... F25B 39/024
165/170
2,934,322 A * 4/1960 Hazard ................. F28D 1/0308
165/170

(Continued)

FOREIGN PATENT DOCUMENTS

JP        2005229102 A  *  8/2005  ......... F28D 15/0266

*Primary Examiner* — Leonard R Leo
(74) *Attorney, Agent, or Firm* — Dickinson Wright PLLC (57) ABSTRACT

The disclosure is related to a heat dissipation structure. The heat dissipation structure is adapted to accommodate a fluid and thermally contact a heat source. The heat dissipation structure includes a heat conductive plate and a channel arrangement. The heat conductive plate is configured to thermally contact the heat source. The channel arrangement is located on the heat conductive plate, and the channel arrangement includes a wider channel portion and a narrower channel portion. The wider channel portion is wider than the narrower channel portion, and the wider channel portion is connected to the narrower channel portion so that the channel arrangement forms a loop. The channel arrangement is configured to accommodate the fluid and allow the fluid to absorb heat generated by the heat source through the heat conductive plate so as to at least partially change phase of the fluid.

5 Claims, 8 Drawing Sheets

(56) References Cited

U.S. PATENT DOCUMENTS

| | | | | |
|---|---|---|---|---|
| 3,226,602 | A | * | 12/1965 | Elfving ............... F28D 15/0233 361/700 |
| 3,817,321 | A | * | 6/1974 | Von Cube ............ H01L 23/427 165/170 |
| 4,550,774 | A | * | 11/1985 | Andres ............... F28D 15/0233 165/104.21 |
| 4,735,609 | A | * | 4/1988 | Comeau ................. A61M 5/44 165/170 |
| 5,076,350 | A | * | 12/1991 | Grantz ............... F28D 15/0233 165/104.21 |
| 5,076,351 | A | * | 12/1991 | Munekawa ......... F28D 15/0233 165/104.21 |
| 5,755,278 | A | * | 5/1998 | Shinohara ................ F28F 3/02 165/104.33 |
| 5,946,939 | A | * | 9/1999 | Matsushima ......... F25B 25/005 165/170 |
| 6,164,368 | A | * | 12/2000 | Furukawa ........... F28D 15/0233 165/104.33 |
| 7,080,680 | B2 | * | 7/2006 | Ota .................... F28D 15/0233 165/104.33 |
| 7,998,427 | B2 | * | 8/2011 | Guarino ................ B01J 19/249 165/170 |
| 9,423,192 | B2 | * | 8/2016 | Tsoi .................... F28D 15/0233 |
| 2006/0157227 | A1 | * | 7/2006 | Choi .................. F28D 15/0233 165/104.21 |

* cited by examiner

HEAT DISSIPATION STRUCTURE

CROSS-REFERENCE TO RELATED APPLICATIONS

This non-provisional application claims priority under 35 U.S.C. § 119(a) on Patent Application No(s). 106145694 filed in Taiwan, R.O.C. on Dec. 26, 2017, the entire contents of which are hereby incorporated by reference.

TECHNICAL FIELD

The disclosure relates to a heat dissipation structure, more particularly to a heat dissipation structure having a wider channel portion and a narrower portion.

BACKGROUND

Work performance of electronic components increase with the progress of technology, but it also generates more heat during operation. Therefore, the electronic components with high work performance are required to cooperate with a heat dissipation device with higher heat dissipation effect, such as an oscillating heat pipe structure. In general, the oscillating heat pipe structure is a heat conductive plate formed with a circulation channel, and the circulation channel is filled with liquid coolant. When the oscillating heat pipe structure thermally contacts the electronic component, the liquid coolant absorbs heat generated by the electronic component, such that the liquid coolant would change its phase so as to be circulated in the circulation channel, thereby decreasing the temperature of the electronic component.

SUMMARY OF THE INVENTION

One embodiment of the disclosure provides a heat dissipation structure is adapted to accommodate a fluid and thermally contact at least one heat source. The heat dissipation structure includes a heat conductive plate and a channel arrangement. The heat conductive plate is configured to thermally contact the at least one heat source. The channel arrangement is located on the heat conductive plate, and the channel arrangement includes a wider channel portion and a narrower channel portion. The width of the wider channel portion is wider than the width of the narrower channel portion, and the wider channel portion is connected to the narrower channel portion so that the channel arrangement forms a loop. The channel arrangement is configured to accommodate the fluid, and allow the fluid to absorb heat generated by the at least one heat source through the heat conductive plate so as to at least partially change phase of the fluid.

One embodiment of the disclosure provides a heat dissipation structure is adapted to accommodate a fluid and thermally contact at least one heat source. The heat dissipation structure includes a heat conductive plate and a plurality of split structures. The heat conductive plate is configured to thermally contact the at least one heat source. The heat conductive plate has a fluid storage chamber. The split structures are dent on the heat conductive plate so as to divide the fluid storage chamber into a plurality of wider channels and a plurality of narrower channels that are connected to one another so as to form a channel arrangement. Each of the wider channels is wider than each of the narrower channels. The channel arrangement is configured to accommodate the fluid, and allow the fluid to absorb heat generated by the at least one heat source through the heat conductive plate so as to at least partially change phase of the fluid.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
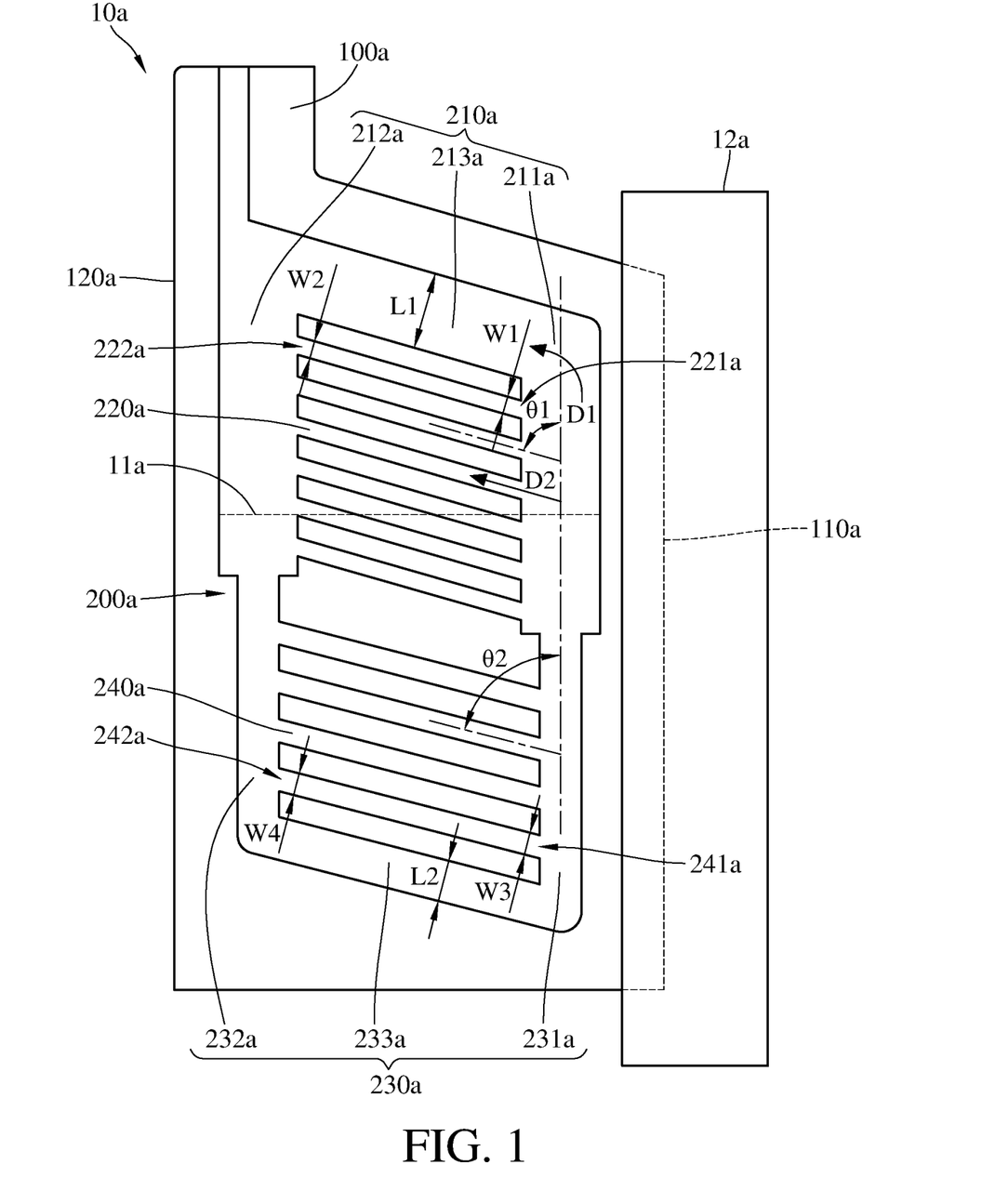
FIG. 1 is a front view of a heat dissipation structure according to a first embodiment of the disclosure while the heat dissipation structure is in thermal contact with a heat source.

Please refer to FIG. 1. FIG. 1 is a front view of a heat dissipation structure according to a first embodiment of the disclosure while the heat dissipation structure is in thermal contact with a heat source.

This embodiment provides a heat dissipation structure 10a, and the heat dissipation structure 10a is adapted to accommodate a fluid 11a and thermally contact a heat source 12a. The fluid 11a is coolant. The heat source 12a is, for example, a CPU. In practical experience, the boiling temperature of the coolant falls within a temperature interval of a normally operating CPU; that is, the temperature of the normally operating CPU can boil the coolant, in order to prevent the CPU from failure due to overly high temperature. For example, the boiling temperature of the coolant is 50° C., and the CPU can normally operate in a temperature ranging between 40° C. and 65° C. In this embodiment, the heat dissipation structure 10a includes a heat conductive plate 100a and a channel arrangement 200a.

The heat conductive plate 100a has a heat absorbing edge 110a and a condensing edge 120a opposite to each other. The heat absorbing edge 110a is configured to thermally contact the heat source 12a. The channel arrangement 200a is located on the heat conductive plate 100a and configured for the circulation of the fluid 11a and the gaseous form thereof. In detail, the channel arrangement 200a includes a wider channel portion 210a, a plurality of first connecting channels 220a, a narrower channel portion 230a and a plurality of second connecting channels 240a.

The wider channel portion 210a includes a first wider channel 211a, a second wider channel 212a, and a third wider channel 213a. The first wider channel 211a and the second wider channel 212a are respectively close to the heat absorbing edge 110a and the condensing edge 120a, and two opposite ends of the third wider channel 213a are respectively connected to the first wider channel 211a and the second wider channel 212a.

Two opposite ends of each first connecting channel 220a are respectively connected to the first wider channel 211a and the second wider channel 212a. Each first connecting channel 220a forms an first acute angle θ1 with respect to the first wider channel 211a, and the first angle θ1, in this embodiment, ranges between 10 degrees and 90 degrees. Each first connecting channel 220a has two first ports 221a and 222a opposite to each other, and the first ports 221a and 222a are respectively connected to the first wider channel 211a and the second wider channel 212a. In each first connecting channel 220, a width W2 of the first port 222a connected to the second wider channel 212a is equal to a width W1 of the first port 221a connected to the first wider channel 211a. That is, the width of the first connecting channel 220a is maintained at the same size from the condensing edge 120a to the heat absorbing edge 110a.

The narrower channel portion 230a includes a first narrower channel 231a, a second narrower channel 232a, and a third narrower channel 233a. The first narrower channel 231a and the second narrower channel 232a are respectively close to the heat absorbing edge 110a and the condensing edge 120a, and respectively connected to two opposite ends of the third narrower channel 233a. An end of the first narrower channel 231a away from the third narrower channel 233a is connected to the first wider channel 211a, and an end of the second narrower channel 232a away from the third narrower channel 233a is connected to the second wider channel 212a, so that the channel arrangement 200a forms a loop. In this embodiment, the wider channels 211a-213a of the wider channel portion 210a are the same in width (e.g., a width L1), the narrower channels 231a-233a of the narrower channel portion 230a are also the same in width (e.g., a width L2), and the width L1 is greater than the width L2. That is, the wider channel portion 210a is wider than the narrower portion 230a.

Two opposite ends of each second connecting channel 240a are respectively connected to the first narrower channel 231a and the second narrower channel 232a. Each second connecting channel 240a forms an second acute angles θ2 with respect to the first narrower channel 231a, and the second acute angle θ2, in this embodiment, ranges between 10 degrees and 90 degrees.

In this embodiment, the first acute angle θ1 between the first connecting channel 220a and the first wider channel 211a is equal to the second acute angle θ2 between the second connecting channel 240a and the first narrower channel 231a, but the present disclosure is not limited thereto. In some other embodiments, an angle between each first connecting channel and the first wider channel may be greater or smaller than an angle between each second connecting channel and the first narrower channel.

In addition, the first acute angles θ1 between the first connecting channels 220a and the first wider channel 211a are fixed at a specific value, but the present disclosure is not limited thereto. In some other embodiments, the angles between the first connecting channels and the first wider channel may vary. In the same manner, the second acute angles θ2 between the second connecting channels 240a and the first narrower channel 231a may be fixed or varied according to actual requirements.

Each of the second connecting channels 240a has two second ports 241a and 242a opposite to each other. The second ports 241a and 242a are respectively connected to the first narrower channel 231a and the second narrower channel 232a. In each second connecting channel 240a, a width W4 of the second port 242a connected to the second narrower channel 232a is equal to a width W3 of the second port 241a connected to the first narrower channel 231a. That is, the width of the second connecting channel 240a is maintained at the same size from the condensing edge 120a to the heat absorbing edge 110a.

In this embodiment, the channel arrangement 200a is configured to accommodate the fluid 11a and allow the fluid 11a to absorb heat generated by the heat source 12a through the heat conductive plate 100a so as to at least partially change phase of the fluid 11a. More specifically, when the fluid 11a absorbs heat near the heat absorbing edge 110a, it would be vaporized to be gaseous and naturally move toward the condensing edge 120a through the first wider channel 211a and the first connecting channels 220a along two directions D1 and D2 by the means of the rising characteristic of high temperature gas. Then, the gaseous fluid 11a reaching the condensing edge 120a would be condensed into liquid form via a thermal energy exchange between it and outer environment, and then the condensed fluid 11a would fall and return to the side near the heat absorbing edge 110a through the narrower channel portion 230a with the assistance of the gravity. As such, the fluid 11a is able to continuously absorb heat near the heat absorbing edge 110a.

In this embodiment, when the gaseous fluid 11a is flowing in the wider channel portion 210a, the resistance of the wider channels 211a-213a is relatively small because the wider channels 211a-213a are wider, such that the flowing velocity of the gaseous fluids 11a is increased, thereby accelerating the circulation of the fluid and improving the heat dissipation capability of the heat dissipation structure 10a.

In addition, the narrower channel portion 230a having relative smaller width is beneficial to create a capillary action when the fluid 11a is flowing therethrough, which helps the fluid 11a to flow more smoothly and fast in the narrower channel portion 230a, thereby improving the heat dissipation capability of the heat dissipation structure 10a.

Moreover, the first acute angles θ1 between the first connecting channels 220a and the first wider channel 211a and the second acute angles θ2 between the second connecting channels 240a and the first narrower channel 231a help that the gaseous fluid 11a to move toward the condensing edge 120a through the first connecting channels 220a, and the condensed fluid 11a to return to the heat absorbing edge 110a through the second connecting channel 240a. Therefore, it helps to improve the circulation of the fluid 11a in the channel arrangement 200a so as to improve the heat dissipation capability of the heat dissipation structure 10a.

Furthermore, due to the narrower channel portion 230a of the channel arrangement 200a, the usage of the fluid 11a being filled into the channel arrangement 200a is able to be decreased, helping to decrease the cost of the fluid 11a.

In the wider channel portion 210a of this embodiment, the wider channels 211-213 are the same in width (e.g., the widths L1), but the present disclosure is not limited thereto. In some other embodiments, the wider channels may be different in width. By doing so, it is able to increase the pressure driving force, such that the imbalance force produced in the channel arrangement is able to accelerate the speed of the cooling circulation so as to further improve the heat dissipation capability of the heat dissipation structure. The aforementioned imbalance force is produced by ΔP in Young-Laplace formula, $$\Delta P = \sigma\left(\frac{1}{R_1} - \frac{1}{R_2}\right),$$

wherein R1 and R2 are respectively the radii of two pipes, σ is the surface tension of a fluid, and ΔP is the pressure driving force causing by variation of pipe width. In addition, similarly, the widths of the narrower channels and widths of the connecting channels may be different.

In this embodiment, the channel arrangement 200a has only one wider channel portion 210a and one narrower channel portion 230a, but the present disclosure is not limited thereto. In some other embodiments, the quantity of the wider channel portion and the narrower channel portion may be adjusted in accordance with the size of the heat conductive plate in order to uniformly conducted away heat generated by the heat source so as to enhancing the efficiency of heat dissipation.

Figure 2:
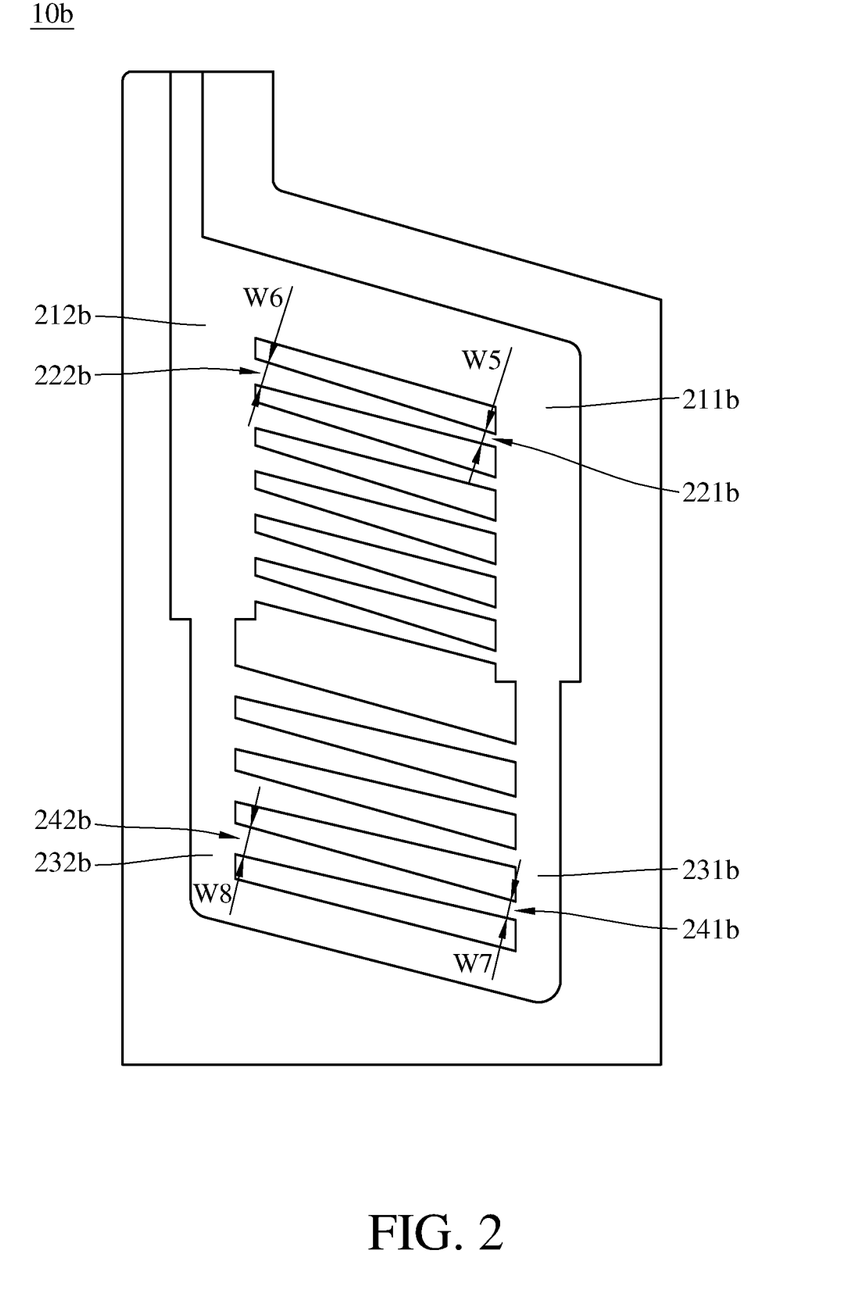
FIG. 2 is a front view of a heat dissipation structure according to a second embodiment of the disclosure.

In this embodiment, the width W1 of the first port 221a is equal to the width W2 of the first port 222a, and the width W3 of the second port 241a is equal to the width W4 of the second port 242a, but the present disclosure is not limited thereto. Please refer to FIG. 2. FIG. 2 is a front view of a heat dissipation structure according to a second embodiment of the disclosure.

This embodiment provides a heat dissipation structure 10b. In the heat dissipation structure 10b, a width W6 of each first port 222b connected to a second wider channel 212b is greater than a width W5 of each first port 221b connected to a first wider channel 211b, and a width W8 of each second port 242b connected to a second narrower channel 232b is greater than a width W7 of each second port 241b connected to a first narrower channel 231b. That is, each first port 222b is wider than each first port 221b, and each second port 242b is wider than each second port 241b.

Figure 3:
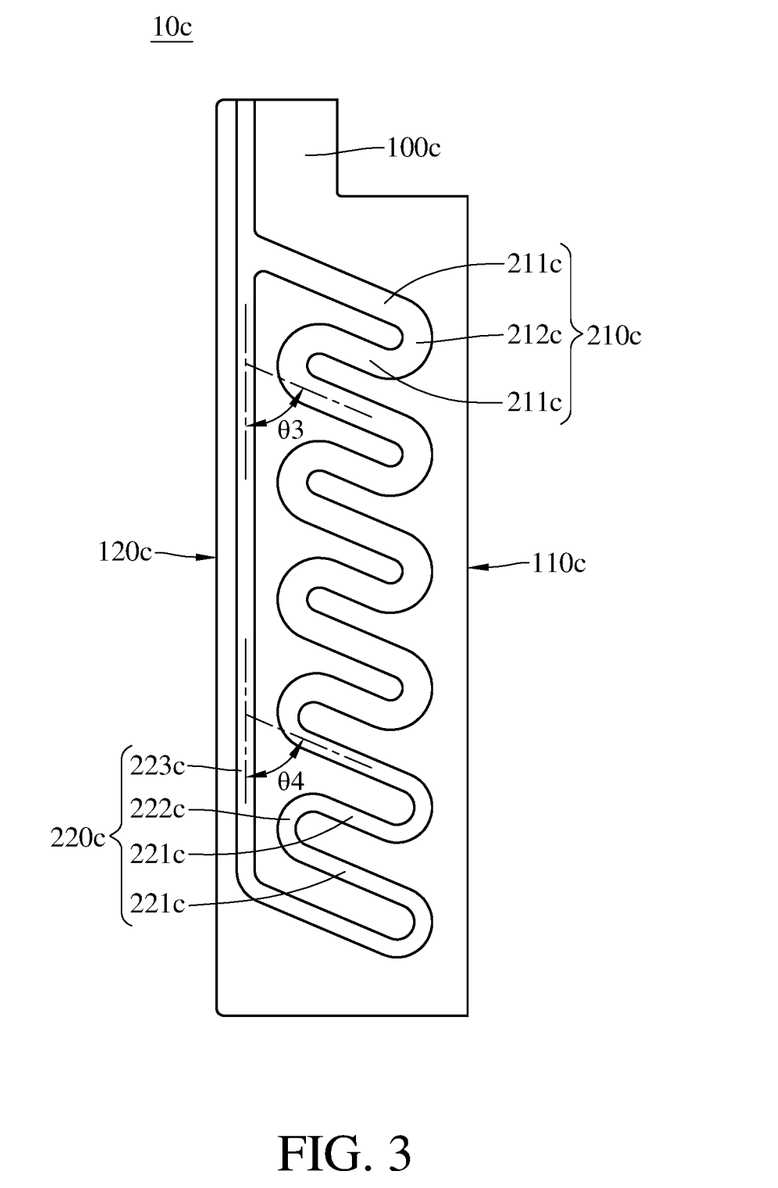
FIG. 3 is a front view of a heat dissipation structure according to a third embodiment of the disclosure.

In the previous embodiments, the wider channels 211a-213a, the narrower channels 231a-233a, and connecting channels 220a and 240a of the channel arrangement 200a are all in straight, but the present disclosure is not limited thereto. Please refer to FIG. 3. FIG. 3 is a front view of a heat dissipation structure according to a third embodiment of the disclosure.

This embodiment provides a heat dissipation structure 10c, the heat dissipation structure 10c has a wider channel portion 210c including a plurality of first inclined channels 211c and a plurality of first curved channels 212c. Two opposite ends of each first curved channel 212c are respectively connected to two of the first inclined channels 211c. The first curved channels 212c and the first inclined channels 211c are arranged along a heat absorbing edge 110c, wherein the first inclined channels 211c are arranged spaced apart from each other and crosswise from the heat absorbing edge 110c to a condensing edge 120c. In addition, the heat dissipation structure 10c further has a narrower channel portion 220c including a plurality of second inclined channels 221c, a plurality of second curved channels 222c and a returning channel 223c. Two opposite ends of each second curved channel 222c are respectively connected to two of the second inclined channels 221c. The second curved channels 222c and the second inclined channels 221c are arranged along the heat absorbing edge 110c, wherein the second inclined channels 221c are arranged spaced apart from each other and crosswise from the heat absorbing edge 110c to the condensing edge 120c. The returning channel 223c is closer to the condensing edge 120c than the first inclined channels 211c and the second inclined channels 221c, and two opposite ends of the returning channel 223c are respectively connected to one of the first inclined channels 211c and one of the second inclined channels 221c that are respectively located at two opposite sides of a heat conductive plate 100c. An angle θ4 between each second inclined channel 221c and the returning channel 223c is equal to an angle θ3 between each first inclined channel 211c and the returning channel 223c. That is, the second inclined channels 221c and the first inclined channels 211c have the same inclination, but the present closure is not limited thereto.

Figure 4:
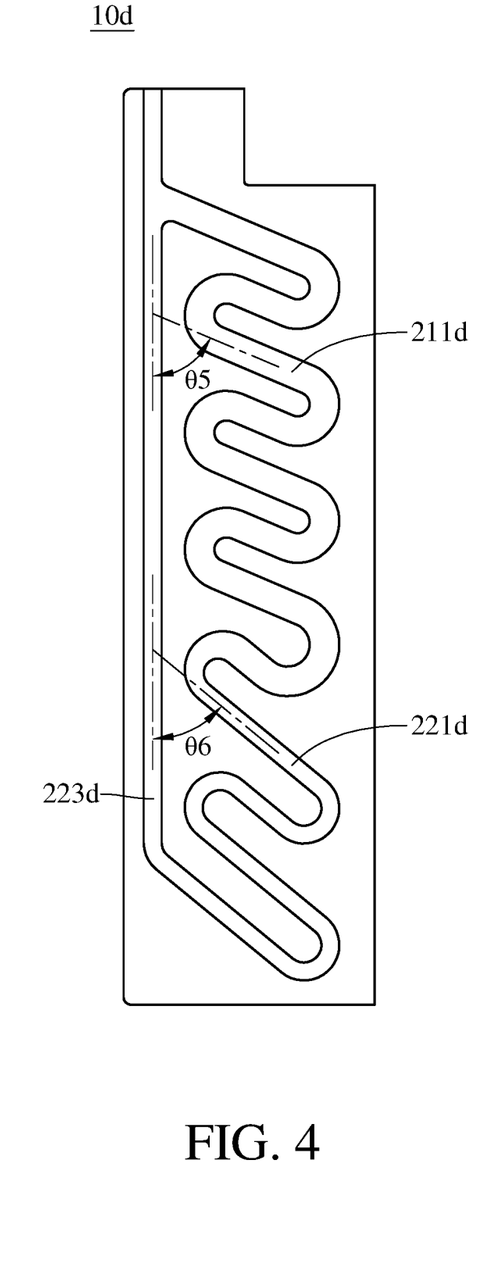
FIG. 4 is a front view of a heat dissipation structure according to a fourth embodiment of the disclosure.

Please refer to FIG. 4. FIG. 4 is a front view of a heat dissipation structure according to a fourth embodiment of the disclosure. This embodiment provides a heat dissipation structure 10d. In the heat dissipation structure 10d, an angle θ6 between each second inclined channels 221d and a returning channel 223d is smaller than an angle θ5 between each first inclined channel 211d and the returning channel 223d. That is, the second inclined channels 221d are more inclined than the first inclined channels 211d.

In the embodiment in FIG. 3, the first curved channels 212c and the second curved channels 222c are connected to the returning channel 223c through inclined channels 211c and 221c, but the present disclosure is not limited thereto.

Figure 5:
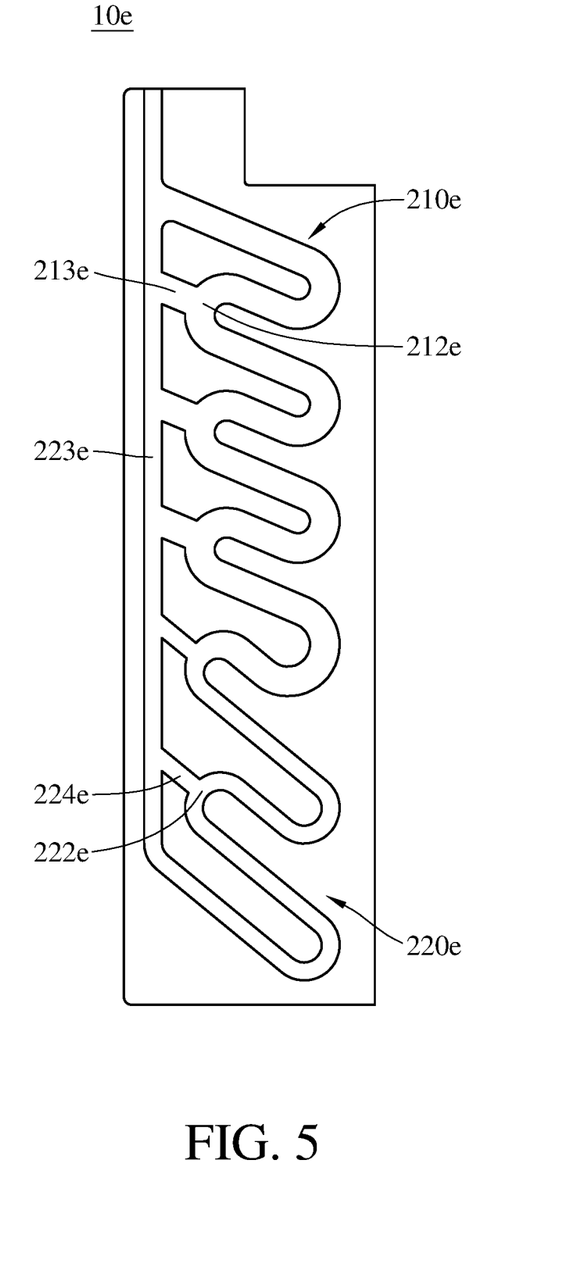
FIG. 5 is a front view of a heat dissipation structure according to a fifth embodiment of the disclosure.

Please refer to FIG. 5. FIG. 5 is a front view of a heat dissipation structure according to a fifth embodiment of the disclosure.

This embodiment provides a heat dissipation structure 10e. The heat dissipation structure 10e has a wider channel portion 210e including a plurality of first connecting channels 213e, and two opposite ends of each first connecting channel 213e are respectively connected to a returning channel 223e and one of first curved channels 212e near the returning channel 223e. In addition, a narrower channel portion 220e further includes a plurality of second connecting channels 224e, and two opposite ends of each second connecting channel 224e are respectively connected to the returning channel 223e and one of second curved channels 222e near the returning channel 223e.

In this embodiment, a part of the first curved channels 212e and a part of the second curved channels 222e are respectively connected to the returning channel 223e through the first connecting channels 213e and the second connecting channels 224e, but the present disclosure is not limited thereto. In some other embodiment, a part of the first curved channels near the returning channel and a part of the second curved channels near the returning channel may be directly connected to the returning channel.

Figures 6, 7:
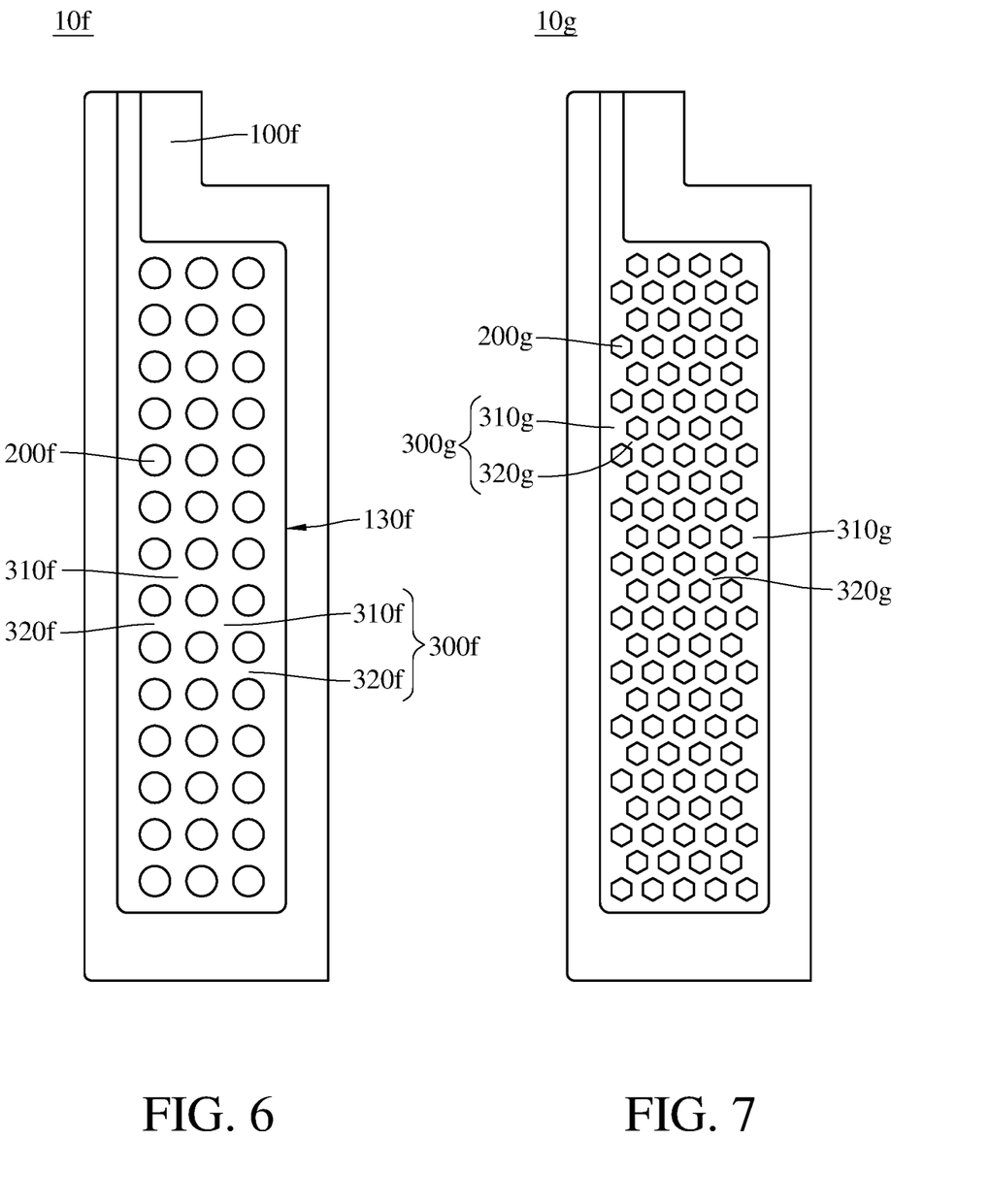
FIG. 6 is a front view of a heat dissipation structure according to a sixth embodiment of the disclosure.
FIG. 7 is a front view of a heat dissipation structure according to a seventh embodiment of the disclosure.

Then, please refer to FIG. 6. FIG. 6 is a front view of a heat dissipation structure according to a sixth embodiment of the disclosure.

This embodiment provides a heat dissipation structure 10f including a heat conductive plate 100f and a plurality of split structures 200f. The heat conductive plate 100f has a fluid storage chamber 130f. The split structures 200f are arranged in an array, and are dent on the heat conductive plate 100f so as to divide the fluid storage chamber 130f into a plurality of wider channels 310f and a plurality of narrower channels 320f that are connected to one another so as to form a channel arrangement 300f. In other word, the split structures 200f are dent on the heat conductive plate 100f, such that the channel arrangement 300f having the wider channels 310f and the narrower channels 320f is formed from the fluid storage chamber 130f. Furthermore, in this embodiment, each split structure 200f is in circular shape, but the present disclosure is not limited thereto.

Please refer to FIG. 7. FIG. 7 is a front view of a heat dissipation structure according to a seventh embodiment of the disclosure. This embodiment provides a heat dissipation structure 10g. The heat dissipation structure 10g includes a plurality of split structures 200g which are arranged in a staggered arrangement, and each split structure 200g is in hexagonal shape. In more detail, a plurality of wider channels 310g and a plurality of narrower channels 320g are formed between the split structures 200g, and the wider channels 310g and the narrower channels 320g together form a channel arrangement 300g.

Figure 8:
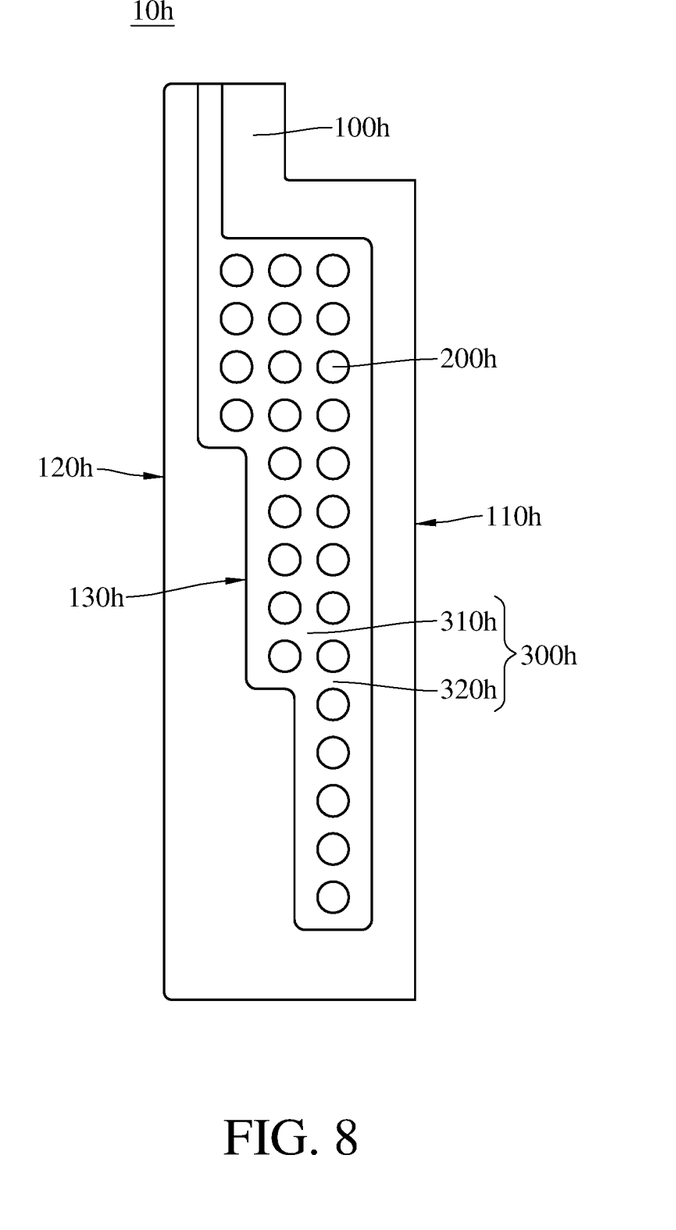
FIG. 8 is a front view of a heat dissipation structure according to an eighth embodiment of the disclosure.

In the split structures in FIG. 6 and FIG. 7, the quantity of the split structures near the heat absorbing edge is equal to the quantity of the split structures near the condensing edge, but the present disclosure is not limited thereto. Please refer to FIG. 8. FIG. 8 is a front view of a heat dissipation structure according to an eighth embodiment of the disclosure. In a heat dissipation structure 10h of this embodiment, the quantity of the split structures 200h near the heat absorbing edge 110h is greater than the quantity of the split structures 200h near the condensing edge 120h. In other words, a part of the split structures 200h near the heat absorbing edge 110h is more than another part of the split structures 200h near the condensing edge 120h; that is, there are more split structures 200h near the heat absorbing edge 110h than the condensing edge 120h. The split structures 200h are dent on a heat conductive plate 100h so as to divide a fluid storage chamber 130h into a plurality of wider channels 310h and a plurality of narrower channels 320h that are connected to one another so as to form a channel arrangement 300h.

Figure 9:
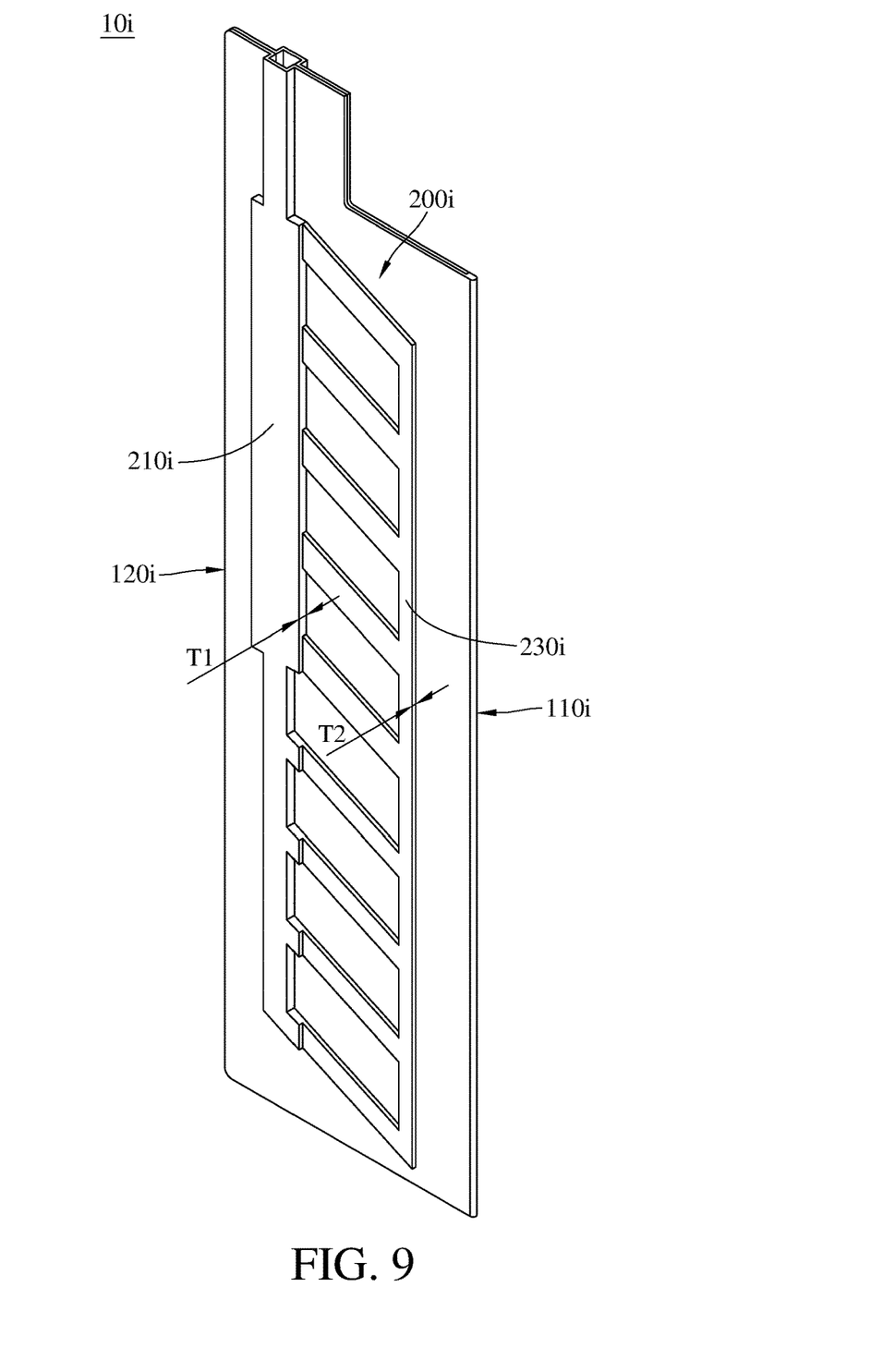
FIG. 9 is a front view of a heat dissipation structure according to a ninth embodiment of the disclosure.

In the previous embodiments, the thickness of each channel arrangement is fixed, but the present disclosure is not limited thereto. Please refer to FIG. 9. FIG. 9 is a front view of a heat dissipation structure according to a ninth embodiment of the disclosure.

This embodiment provides a heat dissipation structure 10i. The heat dissipation structure 10i includes a channel arrangement 200i including a wider channel portion 210i and a narrower channel portion 230i. The wider channel portion 210i and the narrower channel portion 230i are connected to each other to form a loop for the gaseous fluid to be circulated in the channel arrangement 200i. In addition, in this embodiment, a thickness T1 of a side of the channel arrangement 200i near a condensing edge 120i is greater than a thickness T2 of a side of the channel arrangement 200i near a heat absorbing edge 110; that is, the side of the channel arrangement 200i near the condensing edge 120i is thicker than the side of the channel arrangement 200i near the heat absorbing edge 110.

Figure 10:
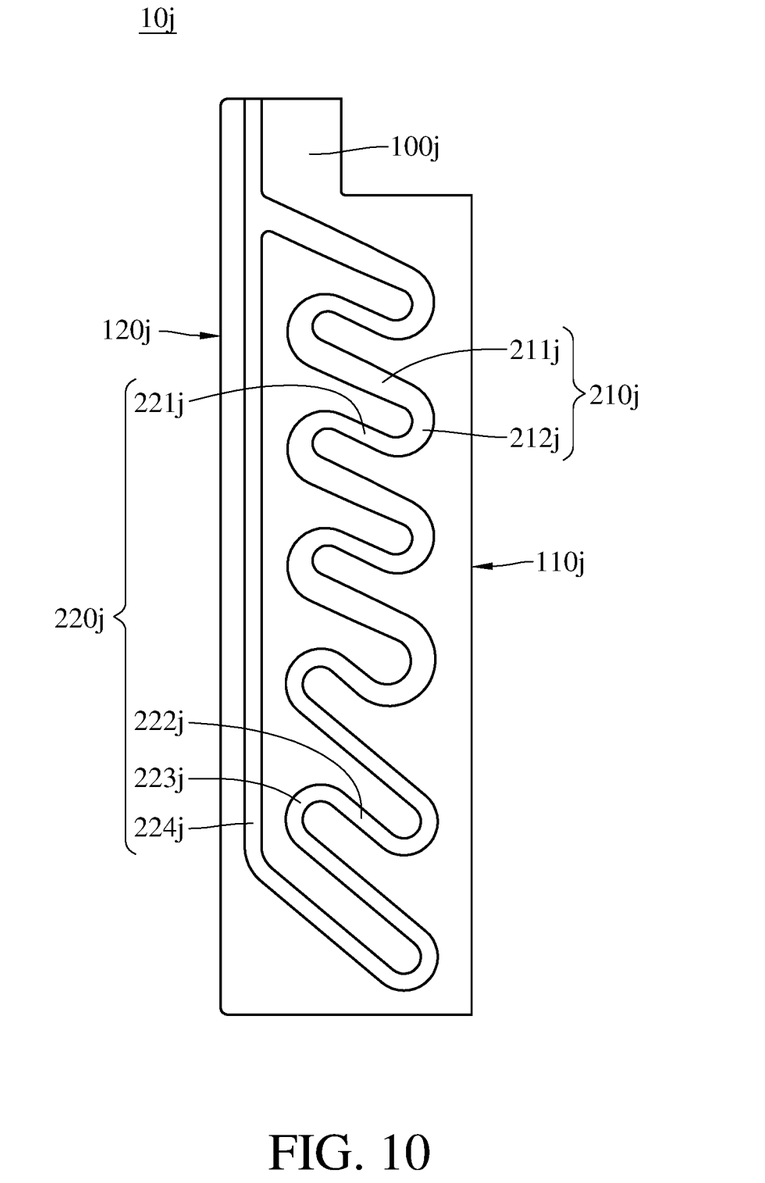
FIG. 10 is a front view of a heat dissipation structure according to a tenth embodiment of the disclosure.

Furthermore, please refer to FIG. 10. FIG. 10 is a front view of a heat dissipation structure according to a tenth embodiment of the disclosure.

This embodiment provides a heat dissipation structure 10j. The heat dissipation structure 10j includes a wider channel portion 210j, which includes a plurality of first inclined channels 211j and a plurality of first curved channels 212j, and a narrower channel portion 220j, which includes a plurality of second inclined channels 221j, a plurality of third inclined channels 222j, a plurality of second curved channels 223j and a returning channel 224j. The first inclined channels 211j, the second inclined channels 221j and the third inclined channels 222j are arranged along a heat absorbing edge 110j; in more detail, the first inclined channels 211j, the second inclined channels 221j and the third inclined channels 222j are arranged spaced apart from each other and crosswise from the heat absorbing edge 110j and a condensing edge 120j. The first inclined channels 211j and the second inclined channels 221j are arranged in a staggered arrangement; that is, one of the first inclined channels 211j is located between two of the second inclined channels 221j. The third inclined channels 222j are located on the same side of the first inclined channels 211j and the second inclined channels 221j. Each of the first curved channels 212j is connected to one of the first inclined channels 211j and one of the second inclined channels 221j that are adjacent to each other, and each of the second curved channels 223j is connected to two of the third inclined channels 222j that are adjacent to each other. The returning channel 224j is closer to the condensing edge 120j than the first inclined channels 211j, the second inclined channel 221j and the third inclined channels 222j, and two opposite ends of the returning channel 224j are respectively connected to one of the first inclined channels 211j and one of the third inclined channels 222j that are respectively located at two opposite sides of the heat conductive plate 100j.

According to the heat dissipation structure as discussed above, the resistance to the gaseous fluid flowing in the wider channel portion is relatively small because the wider channels are wider, such that the flowing velocity of the gaseous fluids is increased, thereby accelerating the circulation of the fluid and improving the heat dissipation capability of the heat dissipation structure.

In addition, the narrower channel portion having relative smaller width is beneficial to create a capillary action when the fluid is flowing therethrough, which helps the fluid to flow more smoothly and fast in the narrower channel portion, thereby improving the heat dissipation capability of the heat dissipation structure.

Moreover, the acute angles between the first connecting channels and the first wider channel and the acute angles between the second connecting channels and the first narrower channel help that the gaseous fluid to move toward the condensing edge through the first connecting channel, and the condensed fluid to return to the heat absorbing edge through the second connecting channel. Therefore, it helps to improve the circulation of the fluid in the channel arrangement so as to improve the heat dissipation capability of the heat dissipation structure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation structure, adapted to accommodate a fluid and thermally contact at least one heat source, comprising:
   a heat conductive plate for thermally contacting the at least one heat source; and
   a sealed channel arrangement located on the heat conductive plate, the channel arrangement comprising a wider channel portion and a narrower channel portion, the wider channel portion wider than the narrower channel portion, the wider channel portion connected to the narrower channel portion so that the channel arrangement forms a closed loop, and the channel arrangement adapted to accommodate the fluid, such that the fluid absorbs heat generated by the at least one heat source through the heat conductive plate so as to at least partially change phase of the fluid wherein the wider channel portion comprises a first wider channel, a second wider channel and a third wider channel, the third wider channel is a sealed fluid conduit along a length with two open opposite ends of the third wider channel respectively fluidly connected to the first wider channel and the second wider channel, wherein the narrower channel portion comprises a first narrower channel, a second narrower channel and a third narrower channel, the third narrower channel is a sealed fluid conduit along a length with two open opposite ends of the third narrower channel respectively fluidly connected to the first narrower channel and the second narrower channel;

wherein the channel arrangement further comprises a plurality of first connecting channels and a plurality of second connecting channels, two opposite ends of each of the plurality of first connecting channels are respectively connected to the first wider channel and the second wider channel, and two opposite ends of each of the plurality of second connecting channels are respectively connected to the first narrower channel and the second narrower channel; and wherein each of the plurality of first connecting channels forms a first acute angle with respect to the first wider channel, and each of the plurality of second connecting channels forms a second acute angle with respect to the first narrower channel.

2. The heat dissipation structure according to the claim 1, wherein the heat conductive plate has a heat absorbing edge and a condensing edge opposite to each other, the first wider channel and the second wider channel are respectively close to the heat absorbing edge and the condensing edge, the first narrower channel and the second narrower channel are respectively close to the heat absorbing edge and the condensing edge, an end of the first narrower channel away from the third narrower channel is connected to the first wider channel, and an end of the second narrower channel away from the third narrower channel is connected to the second wider channel.

3. The heat dissipation structure according to the claim 1, wherein the first acute angle ranges between 10 degrees and 90 degrees, and the second acute angle ranges between 10 degrees and 90 degrees.

4. The heat dissipation structure according to the claim 1, wherein each of the plurality of first connecting channels has two first ports opposite to each other and respectively connected to the first wider channel and the second wider channel, in each of the plurality of first connecting channels, the first port connected to the second wider channel is wider than the first port connected to the first wider channel, each of the plurality of second connecting channels has two second ports opposite to each other and respectively connected to the first narrower channel and the second narrower channel, in each of the plurality of second connecting channels, the second port connected to the second narrower channel is wider than the second port connected to the first narrower channel.

5. The heat dissipation structure according to the claim 1, wherein the heat conductive plate has a heat absorbing edge and a condensing edge opposite to each other, a side of the channel arrangement near the condensing edge is thicker than another side of the channel arrangement near the heat absorbing edge.

\* \* \* \* \*